United States Patent

Okitsu et al.

(10) Patent No.: US 9,189,039 B2
(45) Date of Patent: Nov. 17, 2015

(54) INFORMATION PROCESSING SYSTEM, OPERATION MANAGEMENT METHOD OF INFORMATION PROCESSING SYSTEM, AND DATA CENTER

(71) Applicant: Hitachi, Ltd., Tokyo (JP)

(72) Inventors: Jun Okitsu, Perak (MY); Masayoshi Mase, Yokohama (JP); Tohru Nojiri, Tokyo (JP); Tatsuya Saito, Kunitachi (JP)

(73) Assignee: Hitachi, Ltd., Tokyo (JP)

( * ) Notice: Subject to any disclaimer, the term of this patent is extended or adjusted under 35 U.S.C. 154(b) by 355 days.

(21) Appl. No.: 13/712,135

(22) Filed: Dec. 12, 2012

(65) Prior Publication Data

US 2014/0002987 A1 Jan. 2, 2014

(30) Foreign Application Priority Data

Dec. 15, 2011 (JP) .................................. 2011-274014

(51) Int. Cl.
*G06F 1/20* (2006.01)
*H05K 7/20* (2006.01)

(52) U.S. Cl.
CPC ............ *G06F 1/206* (2013.01); *H05K 7/20836* (2013.01)

(58) Field of Classification Search
CPC .......................... H05K 7/20836; G06F 1/206
USPC ........................ 700/276, 277, 278, 299, 300; 361/679.48, 679.49
See application file for complete search history.

(56) References Cited

U.S. PATENT DOCUMENTS

| | | | |
|---|---|---|---|
| 7,522,418 B2 * | 4/2009 | Ishimine ........................ | 361/699 |
| 7,644,148 B2 * | 1/2010 | Ranganathan et al. ....... | 709/223 |
| 8,127,298 B2 | 2/2012 | Kato et al. | |
| 8,145,927 B2 | 3/2012 | Okitsu et al. | |
| 8,584,134 B2 * | 11/2013 | Yamaoka et al. ............. | 718/104 |
| 8,725,307 B2 * | 5/2014 | Healey et al. ................. | 700/300 |
| 2009/0259345 A1 * | 10/2009 | Kato et al. ..................... | 700/295 |
| 2010/0298997 A1 * | 11/2010 | Ohba et al. .................... | 700/291 |
| 2010/0330896 A1 | 12/2010 | Ohba et al. | |
| 2011/0010717 A1 * | 1/2011 | Yamaoka et al. ............. | 718/102 |
| 2011/0223849 A1 | 9/2011 | Ishimine et al. | |
| 2011/0314853 A1 * | 12/2011 | Ito et al. .......................... | 62/186 |
| 2012/0026686 A1 | 2/2012 | Suzuki et al. | |
| 2012/0052785 A1 * | 3/2012 | Nagamatsu et al. .......... | 454/184 |
| 2012/0303166 A1 * | 11/2012 | Chang .......................... | 700/282 |

FOREIGN PATENT DOCUMENTS

| | | |
|---|---|---|
| JP | 05-127785 | 5/1993 |
| JP | 2010-133626 A | 6/2010 |
| JP | 2011-007423 A | 1/2011 |
| JP | 2011-190967 A | 9/2011 |
| WO | WO 2010/010617 A1 | 1/2010 |

* cited by examiner

*Primary Examiner* — Charles Kasenge
(74) *Attorney, Agent, or Firm* — Foley & Lardner LLP

(57) ABSTRACT

An information processing system which determines an allowable temperature of intake air to an information processing apparatus based on information of a temperature of intake air to the information processing apparatus, information of a temperature of exhaust air of the information processing apparatus, information of a power consumption of the information processing apparatus, and information of an allowable temperature of exhaust air of the information processing apparatus to thereby save power of the information processing system.

16 Claims, 6 Drawing Sheets

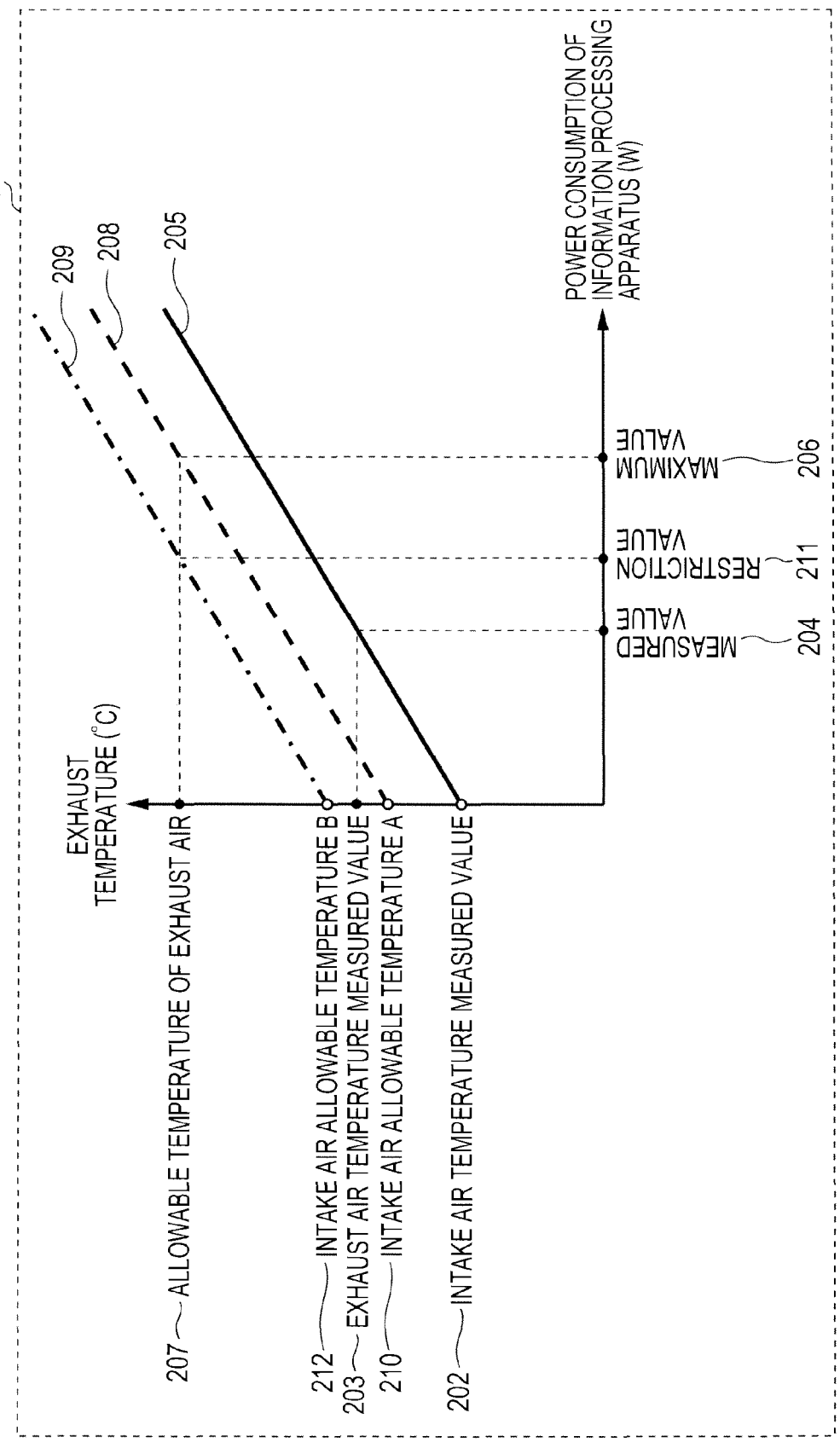

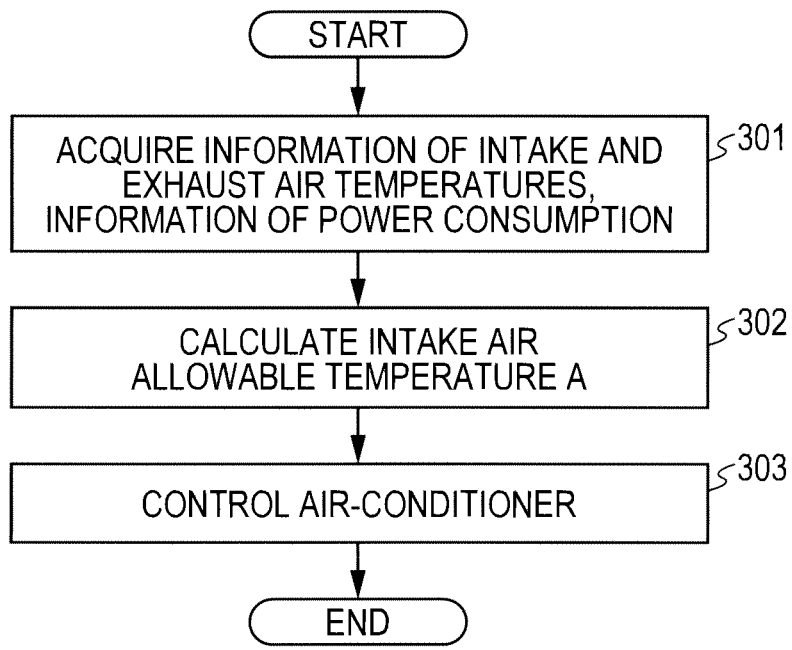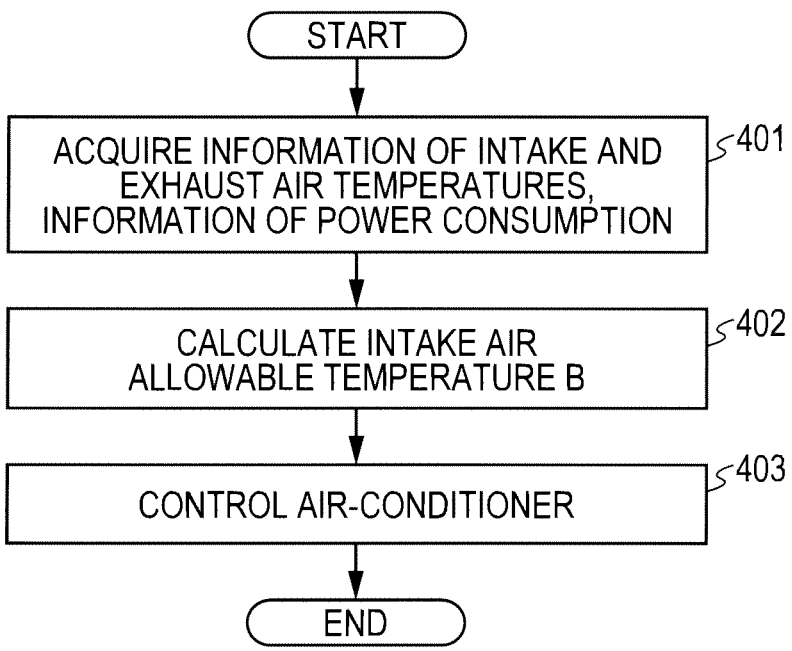

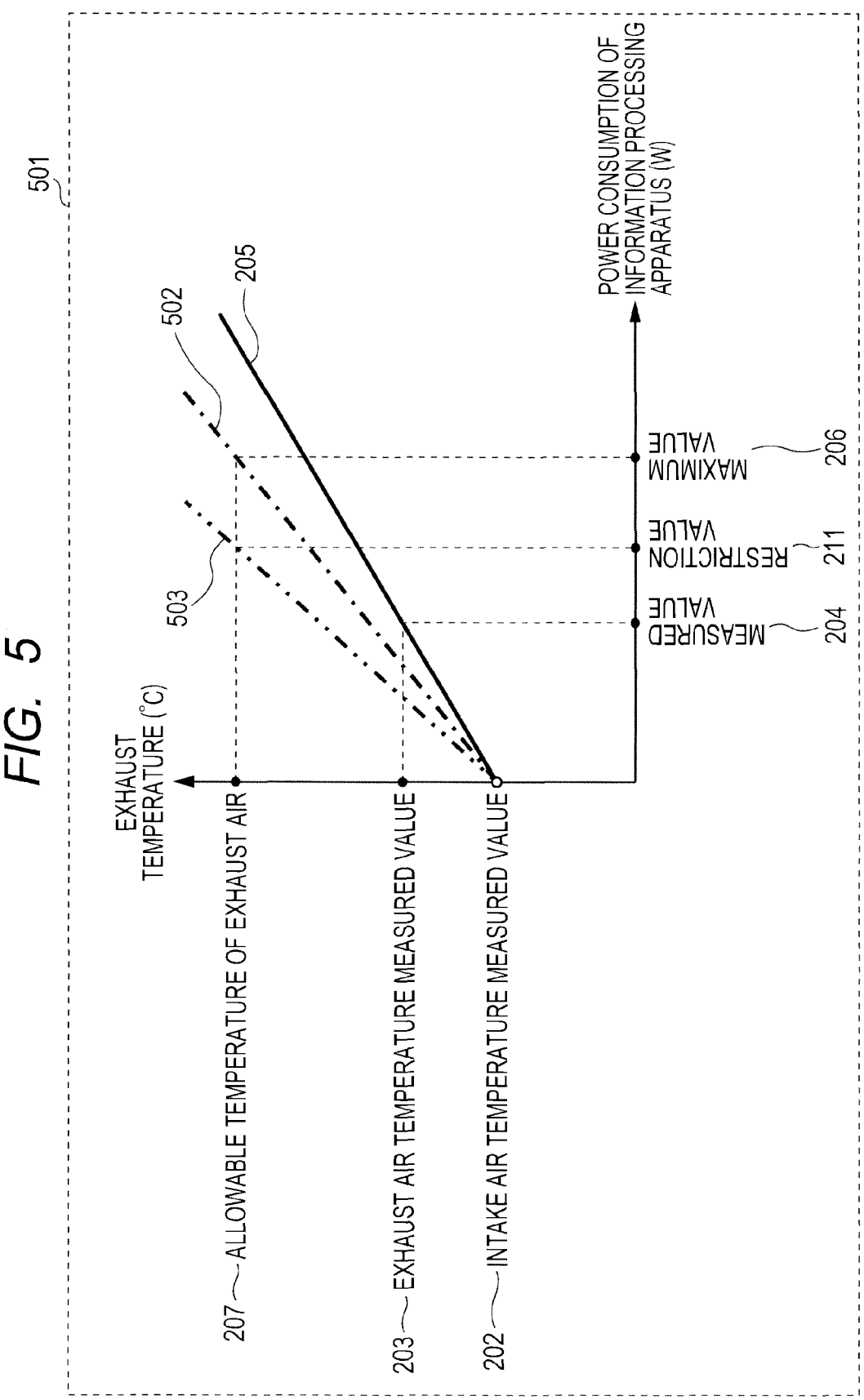

US 9,189,039 B2

INFORMATION PROCESSING SYSTEM, OPERATION MANAGEMENT METHOD OF INFORMATION PROCESSING SYSTEM, AND DATA CENTER

CLAIM OF PRIORITY

The present application claims priority from Japanese patent application JP 2011-274014 filed on Dec. 15, 2011, the content of which is hereby incorporated by reference into this application.

FIELD OF THE INVENTION

The present invention relates to an information processing system, an operation management method of an information processing system, and a data center, particularly relates to cooling of an information processing apparatus.

BACKGROUND OF THE INVENTION

Air cooling is mainly used for cooling an information processing apparatus of an information processing system. Generally, an information processing apparatus is cooled with cold air supplied by an air-conditioner that is taken into the information processing apparatus mounted on a rack.

Japanese Unexamined Patent Application Publication No. 2011-7423 discloses a technology of controlling supply air volume of an air-conditioner such that a temperature of air blown out from the air-conditioner and a temperature of intake air to a rack are the same temperature.

SUMMARY OF THE INVENTION

Ordinarily, cold air at, for example, 24° C. is made to be introduced into an information processing apparatus with a sufficient air volume such that the information processing apparatus is not overheated. On the other hand, a power cost is taken for supplying sufficiently cooled air with a sufficient air volume. Here, it is rare that a work-load near to 100% of an allowable amount is always given to an information processing system. Hence, the inventors have investigated to achieve power saving of an information processing system not by always supplying sufficiently cooled air to whole of the information processing system with a sufficient air volume, but elevating a temperature of cold air, or restraining the air volume of the cold air in accordance with a situation.

The present invention has been carried out in view of the above-described, and it is an object thereof to achieve power saving of an information processing system.

The present invention resolves the problem described above by determining an allowable temperature of intake air to an information processing apparatus based on information of a temperature of intake air to the information processing apparatus, information of a temperature of exhaust air from the information processing device, information of power consumption of the information processing apparatus, and information of an allowable temperature of the exhaust air from the information processing apparatus.

According to the present invention, power consumption of an information processing apparatus can be restrained by enabling to supply cold air in accordance with a situation.

BRIEF DESCRIPTION OF THE DRAWINGS

FIG. 2 is a diagram for explaining a relationship among a temperature of intake air to an information processing apparatus, a temperature of exhaust air from the information processing apparatus, and power consumption of the information processing apparatus according to the present invention;

FIG. 3 is a flowchart showing an example of controlling an intake air temperature of the information processing system according to the present invention;

FIG. 4 is a flowchart showing an example of controlling intake air temperature of the information processing system according to the present invention;

FIG. 5 is a diagram for explaining a relationship among a temperature of intake air to the information processing apparatus, a temperature of exhaust air from the information processing apparatus, and power consumption of the information processing apparatus according to the present invention;

DETAILED DESCRIPTION OF THE PREFERRED EMBODIMENTS

An explanation will be given of embodiments in reference to the drawings as follows.

First Embodiment

Figure 1:
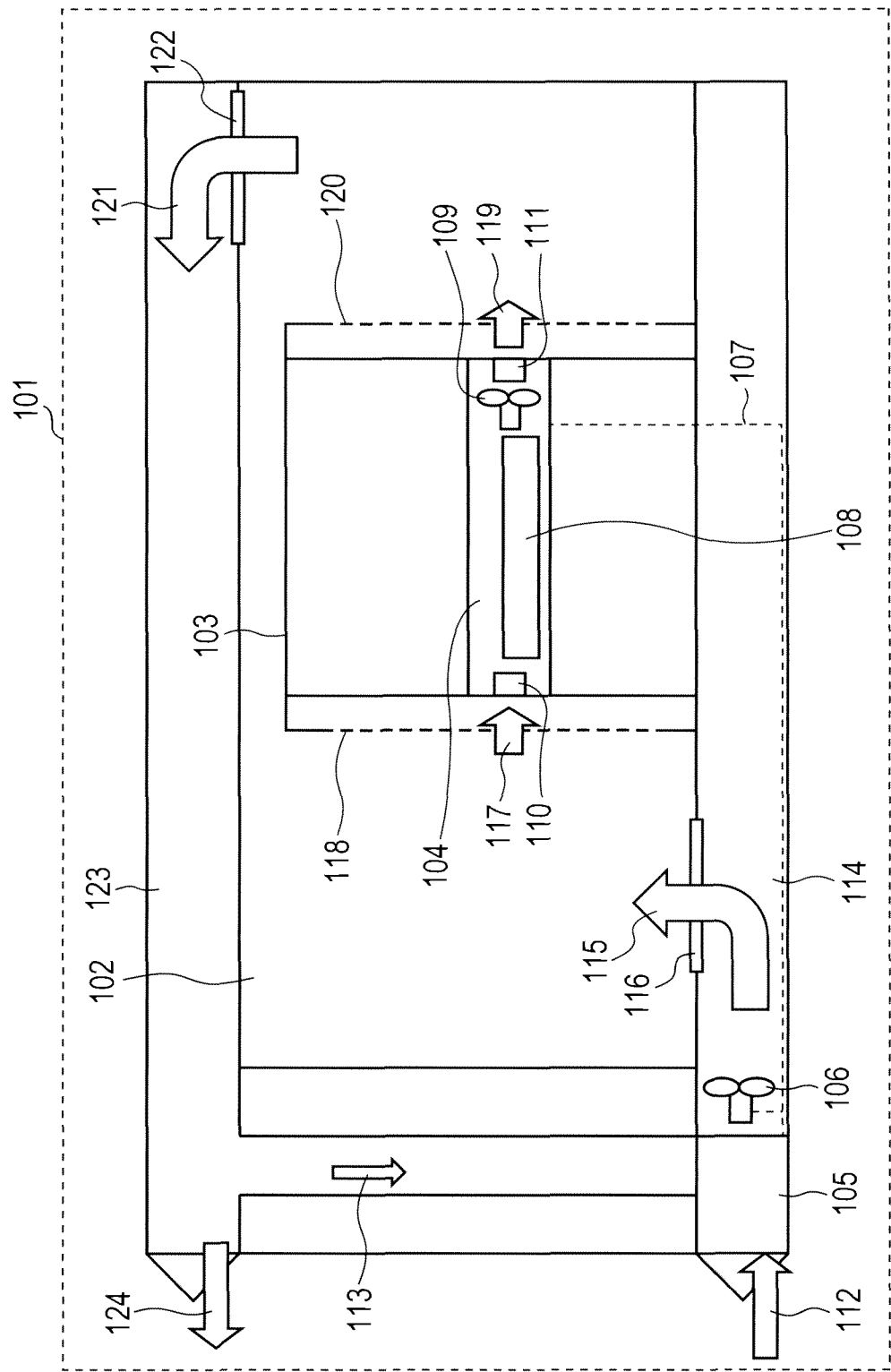
FIG. 1 is a diagram showing an embodiment of an information processing system according to the present invention.

FIG. 1 shows an information processing system 101 according to an embodiment of the present invention. The information processing system 101 includes an information processing apparatus 104 mounted on a rack 103 in a computer room 102. The information processing system 101 includes an outside air-conditioner 105, and an air fan 106 as an air conditioning equipment for cooling the information processing apparatus 104. The information processing apparatus 104, the outside air-conditioner 105, and the air fan 106 are connected via wirings 107 indicated by a dotted line in FIG. 1. The information processing apparatus 104 can control the outside air-conditioner 105 and the air fan via the wirings 107.

The information processing apparatus 104 is a server device according to the present embodiment, and a given work-load is an application. The information processing apparatus 104 includes a board 108 mounted with CPU or a memory, an air cooling fan 109 of exhausting warm air generated at the information processing apparatus 104, a temperature sensor 110 for measuring a temperature of intake air to the information processing apparatus 104, and a temperature sensor 111 for measuring a temperature of exhaust air from the information processing apparatus 104.

The outside air-conditioner 105 carries out air-conditioning by taking in outside air as indicated by an arrow mark 112, and a portion of exhaust air from the computer room 102 as indicated by an arrow mark 113. Air air-conditioned by the outside air-conditioner 105 is blown out to a space 114 under double floors of the computer room 102, and is introduced into the computer room 102 from a blow out port 116 as indicated by an arrow mark 115 by the air fan 106. The information processing apparatus 104 sucks air introduced from the blow out port 116 from a front face panel 118 of a mesh of the rack 103 as indicated by an arrow mark 117, and exhausts warm air produced by heat generation of the information processing apparatus 104 from a back face panel 120 of a mesh of the rack 103 as indicated by an arrow mark 119 by operating the air cooling fan 109. The warm air exhausted from the back face panel 120 is exhausted from a suction port 122 to an exhaust duct 123 as indicated by an arrow mark 121. A portion of the warm air exhausted to the exhaust duct 123 is returned to the outside air-conditioner 105 as indicated by the arrow mark 113, and the remainder is exhausted to outside as indicated by an arrow mark 124.

An explanation will be given of an operation of the information processing system 101 in reference to FIG. 2 as follows. A graph 201 of FIG. 2 is a graph for explaining a relationship among the temperature of the intake air to the information processing apparatus, the temperature of the exhaust air from the information processing apparatus, and power consumption of the information processing apparatus.

The information processing apparatus 104 acquires a measurement result of the temperature sensor 110, and a measurement result of the temperature sensor 111, and stores the measurement results to a memory of the information processing apparatus 104. Also, the information processing apparatus 104 acquires information of power consumption of the information processing apparatus 104, and stores the information to the memory of the information processing apparatus 104. As methods of acquiring the information of the power consumption of the information processing apparatus 104, there are, for example, a method of providing a power meter to the information processing apparatus 104, and acquiring the information of the power consumption of the information processing apparatus 104 from the power meter, and a method of predicting to acquire the power consumption of the information processing apparatus 104 from a rated power of the information processing apparatus 104, and a CPU using rate of the information processing apparatus 104 which is a server device. In the graph 201, the measurement result of the temperature sensor 110 corresponds to an intake air temperature measured value 202, the measurement result of the temperature sensor 111 corresponds to an exhaust air temperature measured value 203, and the power consumption of the information processing apparatus 104 corresponds to a measured value 204, respectively.

Here, the power consumption of the information processing apparatus 104 corresponds to an amount of heat which can be removed from the information processing apparatus 104 during unit time by air cooling in a steady state. That is, the following relationship is established among an amount Q of wind flowing in the information processing apparatus 104, an intake air temperature $T_i$ of the information processing apparatus 104, an exhaust air temperature $T_o$ of the information processing apparatus 104, and a power consumption Wi of the information processing apparatus with α as a constant.

$$T_o - T_i = \alpha W_i / Q \quad \text{(Equation 1)}$$

Therefore, there can be obtained a relationship indicated by a solid line 205 from the intake air temperature measured value 202, the exhaust air temperature measured value 203, and the measured value 204, that is, a relationship between the power consumption of the information processing apparatus 104 and the exhaust air temperature of the information processing apparatus 104.

The solid line 205 of the graph 201 shows a state where sufficiently cooled air at, for example, 24° C. is supplied with a sufficient air volume. Therefore, even when the power consumption of the information processing apparatus 104 reaches a maximum value 206, the exhaust air temperature of the information processing apparatus 104 is lower than an allowable temperature 207 of the exhaust air of the information processing apparatus 104. Here, the allowable temperature 207 of the exhaust air may be an operation guaranteeing temperature which is an exhaust air temperature for guaranteeing an operation of the information processing apparatus, or a temperature of subtracting a margin from the operation guaranteeing temperature. The operation guaranteeing temperature is, for example, 35° C., and the temperature of subtracting the margin from the operation guaranteeing temperature is, for example, 34° C. Here, the maximum value of the power consumption of the information processing apparatus 104 corresponds to, for example, a CPU using rate of 100%.

When the intake air temperature $T_i$ is elevated, also the exhaust air temperature $T_o$ is similarly elevated from (Equation 1) in a case where the air volume Q is constant. Therefore, when the intake air temperature $T_i$ is elevated, the relationship among the temperature of the intake air to the information processing apparatus, the temperature of the exhaust air of the information processing apparatus, and the power consumption of the information processing apparatus is shifted from the solid line 205 as in a broken line 208, or a one-dotted chain line 209 while maintaining an inclination of the solid line 205.

The broken line 208 is configured by plotting a condition in which the temperature of the exhaust air of the information processing apparatus becomes the allowable temperature 207 of the exhaust air of the information processing apparatus in a case where the power consumption of the information processing apparatus is the maximum value 206, and the intake air temperature at this occasion is defined as an intake air allowable temperature A210. The information processing apparatus 104 can be operated at the allowable temperature 207 of the exhaust air or lower even when the information processing apparatus 104 is applied with a maximum load, for example, a work-load by which the CPU using rate becomes 100% by making the intake air temperature equal to or lower than the intake air allowable temperature A210. Here, an air-conditioning power can be reduced by elevating a set temperature of the outside air-conditioner 105 which is an air-conditioner within a range in which the intake air temperature is equal to or lower than the intake air allowable temperature A210. For example, a necessity of additional air-conditioning is generally brought about generally by a heat exchanger or the like in a state in which the temperature of the outside air is at 24° C. or higher. However, the additional air-conditioning can be avoided by elevating the set temperature and the air-conditioning power can be reduced. Therefore, the power of the information processing system 101 can be saved. Even in a case in which the information processing apparatus 104 is cooled by supplying cold air to the space 114 under the double floors of the computer room 102 by an air-conditioner by heat exchange in place of the outside air-conditioner 105, the air-conditioning power can be reduced by elevating the set temperature of the air-conditioner, and the power of the information processing system can be saved.

FIG. 3 is a flowchart showing an example of controlling to elevate the intake air temperature within a range equal to or lower than the intake allowable temperature A210. At step 301, the information processing apparatus 104 acquires the measurement result of the temperature sensor 110 as information of the temperature to the intake air of the information processing apparatus 104, the measurement result of the temperature sensor 111 as information of the temperature of the exhaust air of the information processing apparatus 104, and information of the power consumption of the information processing apparatus 104. A work-load applied to the information processing apparatus 104 at this occasion may be a work-load which is previously prepared for training for setting air-conditioning of the information processing system 101, or may be a work-load which is applied to the information processing apparatus 104 in a state of actually operating the information processing apparatus 104.

At step 302, the information processing apparatus 104 calculates the intake air allowable temperature A210 as described above based on the acquired measurement result of the temperature sensor 110, the acquired measurement result of the temperature sensor 111, information of the acquired power consumption of the information processing apparatus 104, and information of the allowable temperature of the exhaust air of the information processing apparatus 104. The information of the allowable temperature of the exhaust air of the information processing apparatus 104 may be information of the operation guaranteeing temperature of the exhaust air which is provided in a specification of the information processing apparatus 104 that is previously stored to the memory of the information processing apparatus 104, or may be a temperature of subtracting a margin from the operation guaranteeing temperature of the exhaust air which is provided in the specification of the information processing apparatus 104 that is previously stored to the memory of the information processing apparatus 104 as information of the allowable temperature of the exhaust air.

At step 303, the information processing apparatus 104 elevates the set temperature of the outside air-conditioner 105 which is the air-conditioner such that the temperature of the intake air to the information processing apparatus 104 is proximate to the calculated intake air allowable temperature A210. For example, in a case where the intake air temperature measured at step 301 is 24° C., and the intake air allowable temperature A210 is 27° C., the information processing apparatus 104 can make the temperature of the intake air to the information processing apparatus 104 proximate to a target value by setting the target value of the temperature of the intake air to the information processing apparatus 104 to 26° C. by subtracting a margin of 1° C. from the intake air allowable temperature A210, and controlling the set temperature of the outside air-conditioner 105 which is the air-conditioner by a PID control while measuring the temperature of the intake air by the temperature sensor 110. The information processing apparatus 104 determines the set temperature of the outside air-conditioner 105 which is the air-conditioner when the temperature of the intake air can sufficiently be proximate to the target value.

In the information processing system 101, there is a case where it is not necessarily needed to use the information processing apparatus 104 at the CPU using rate of 100%, and an operator of the information processing system 101 can restrict the CPU using rate down to, for example, 70%. That is, in the information processing system 101, the power consumption of the information processing apparatus 104 can be restricted based on information of restricting the power consumption of the information processing apparatus 104. When the power consumption of the information processing apparatus 104 is restricted, the intake air allowable temperature of the information processing apparatus 104 can further be elevated. Here, information of restricting the power consumption of the information processing apparatus 104 is, for example, a restriction value of the CPU using rate of the information processing apparatus 104 set by an operator of the information processing system 101, and can be stored to the memory of the information processing apparatus 104.

FIG. 2 shows a restriction value 211 for explaining a situation of restricting the power consumption of the information processing apparatus. As is known from FIG. 2, the information processing apparatus can be operated within the range of the allowable temperature 207 of the exhaust air by making the temperature of the intake air to the information processing apparatus equal to or lower than an intake air allowable temperature B212 by making the power consumption of the information processing apparatus equal to or lower than the restriction value 211. Therefore, when the power consumption of the information processing apparatus 104 is restricted, the intake air allowable temperature of the information processing apparatus 104 can be elevated to be higher than the intake air allowable temperature A210, and the air-conditioning power can further be reduced.

FIG. 4 is a flowchart showing an example of controlling to elevate the intake air temperature within a range equal to or lower than the intake air allowable temperature B212. At step 401, similar to step 301, the information processing apparatus 104 acquires the measurement result of the temperature sensor 110, the measurement result of the temperature sensor 111, and information of the power consumption of the information processing apparatus 104. At step 402, the information processing apparatus 104 calculates the intake air allowable temperature B212 as described above based on information of restricting the power consumption of the information processing apparatus 104 set by an operator of the information processing system 101 in addition to the acquired measurement result of the temperature sensor 110, the acquired measurement result of the temperature sensor 111, the acquired information of the power consumption of the information processing apparatus 104, and the information of the allowable temperature of the exhaust air of the information processing apparatus 104. At step 403, similar to step 303, the information processing apparatus 104 elevates the set temperature to the outside air-conditioner 105 which is the air-conditioner such that the temperature of the intake air to the information processing apparatus 104 is proximate to the calculated intake air allowable temperature B212. For example, in a case where the intake air temperature measured at step 401 is 24° C., and the intake air allowable temperature B212 is 28° C., the information processing apparatus 104 can make the temperature to the intake air of the information processing apparatus 104 proximate to a target value by setting the target value of the temperature of the intake air to the information processing apparatus 104 to 27° C. by subtracting a margin of 1° C. from the intake air allowable temperature B212, and controlling the set temperature of the outside air-conditioner 105 which is the air-conditioner by a PID control while measuring the temperature of the intake air by the temperature sensor 110. The information processing apparatus 104 determines the set temperature of the outside air-conditioner 105 which is the air-conditioner when the intake air temperature can be made to be sufficiently proximate to the target value.

Although a description has been given of the change of the temperature setting of the air-conditioner as described above, the power consumption of the information processing system 101 can be reduced also by reducing the air volume. An explanation will be given of making the power consumption low by reducing the air volume.

A graph 501 of FIG. 5 plots a one-dotted chain line 502 and a two-dotted chain line 503 in place of the broken line 208 and the one-dotted chain line 209 of the graph 201 of FIG. 2. As is known from (Equation 1), when the air volume Q is reduced, an inclination of plotting of the graph 501 is increased. Therefore, in a case where the CPU using rate of the information processing apparatus 104 is not restricted, that is, the power consumption of the information processing apparatus 104 is not restricted, the information processing apparatus 104 can control to reduce the air volume, that is, a rotational speed of the air fan 106 which blows the cold air from the outside air-conditioner 105 which is the air-conditioner within a range equal to or lower than an inclination of the one-dotted chain line 502. Thereby, the power consumption of the air fan 106 can be reduced, and the power consumption of the information processing system 101 can be reduced. In a case where the power consumption of the information processing apparatus 104 is restricted by the restriction value 211, the information processing apparatus 104 can control to reduce the air volume, that is, the rotational speed of the air fan 106 within a range equal to or lower than an inclination of the two-dotted chain line 503. Thereby, the power consumption of the air fan 106 can further be reduced, and the power consumption of the information processing system 101 can further be reduced.

Second Embodiment

Figure 6:
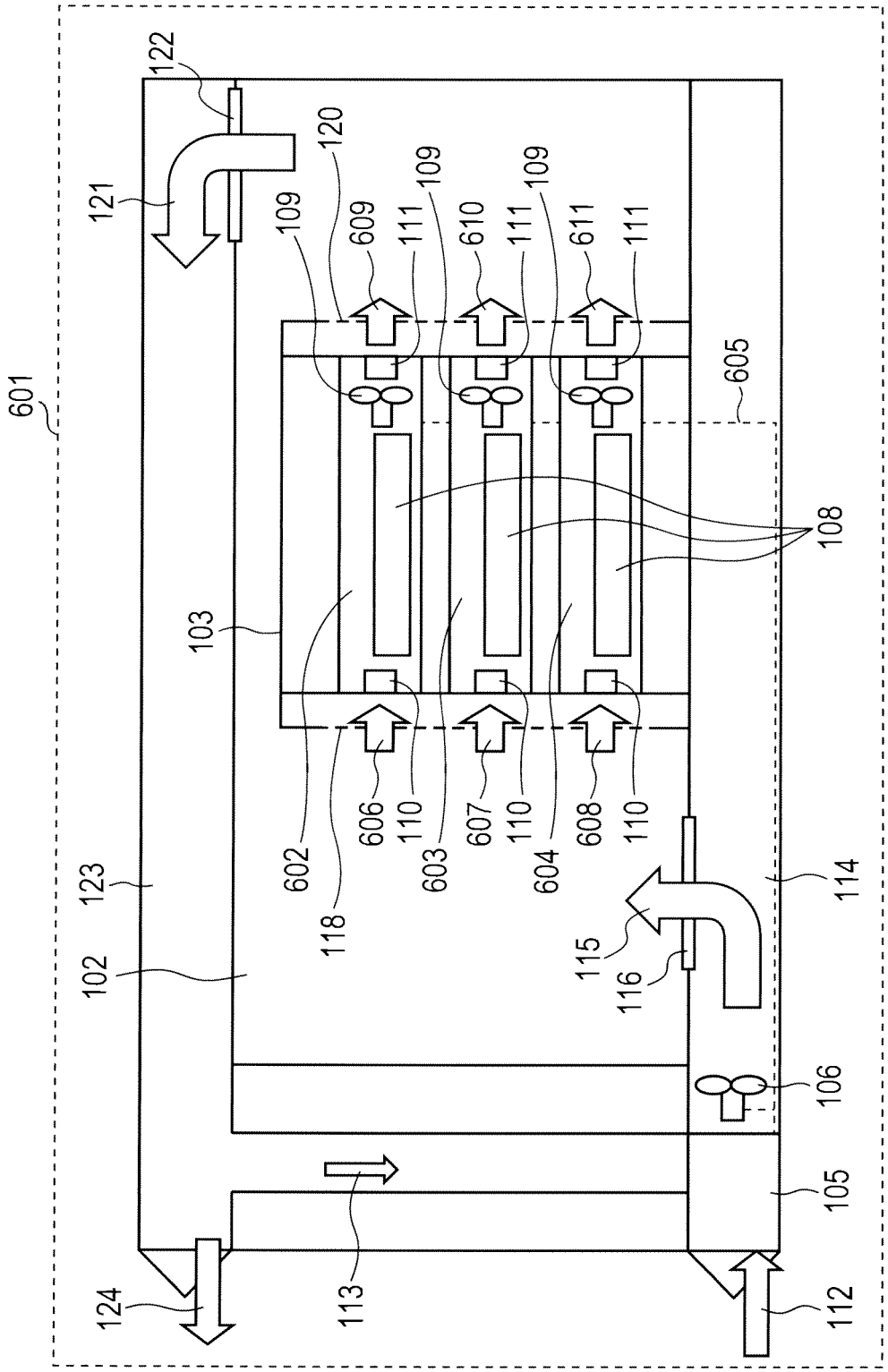
FIG. 6 is a diagram showing an embodiment of an information processing system according to the present invention.

Although in First Embodiment, the explanation has been given of the information processing system 101 including the single information processing apparatus, according to the present embodiment, there is shown an example of an information processing system including plural information processing apparatuses. FIG. 6 shows an information processing system 601 according to the present embodiment. Hereinafter, an explanation will mainly be given of what differs from First Embodiment, and an explanation of what is common to First Embodiment will be omitted.

The information processing system 601 differs from the information processing system 101 in including 3 pieces of information processing apparatuses of an information processing apparatus 602, an information processing apparatus 603, and an information processing apparatus 604 at the rack 103. Here, the information processing apparatus 602 and the information processing apparatus 603 are server devices which execute applications as a work-load. The information processing apparatus 604 is a server device for managing an operation which is operated as a computer for managing an operation of the information processing system 601. Each of the information processing apparatuses 602-604 includes the board 108 mounted with CPU, a memory or the like, the air cooling fan 109, the temperature sensor 110 for measuring a temperature of intake air, and the temperature sensor 111 for measuring a temperature of exhaust air similar to the information processing apparatus 104. The information processing apparatuses 602-604, the outside air-conditioner 105, and the air fan 106 are connected via wirings 605 indicated by a dotted line. The information processing apparatus 604 which is a computer for managing an operation can control the information processing apparatus 602, the information processing apparatus 603, the outside air-conditioner 105, and the air fan 106 via the wirings 605. Cold air of the computer room 102 is introduced to the respective information processing apparatuses as shown by arrow marks 606-608, and warm air from the respective information processing apparatuses is exhausted as shown by arrow marks 609-611. Here, positions of mounting the respective information processing apparatuses to the rack 103 differ from each other. Therefore, air volumes of the cold air introduced to the respective information processing apparatuses are not necessarily uniform among the respective information processing apparatuses.

The information processing apparatus 604 which is a computer of managing an operation acquires measurement results of the respective temperature sensors 110 of the information processing apparatuses 602-603 as information of respective temperatures of intake air of the information processing apparatuses 602-603, and the measurement results of the respective temperature sensors 111 of the information processing apparatuses 602-603 as information of respective temperatures of exhaust air of the information processing apparatuses 602-603, and stores the measurement results to a memory of the information processing apparatus 604. Also, the information processing apparatus 604 acquires information of respective power consumptions of the information processing apparatuses 602-603 and stores the information to the memory of the information processing apparatus 604.

The information processing apparatus 604 can calculate the intake air allowable temperatures A210 for the respective information processing apparatuses based on the acquired measurement results of the respective temperature sensors, the acquired information of the power consumptions of the respective information processing apparatuses, information of allowable temperatures of exhaust air of the respective information processing apparatuses. Here, as the information of the respective allowable temperatures of exhaust air of the information processing apparatuses 602-603, information of operation guaranteeing temperatures of exhaust air which are provided at the specifications of the information processing apparatuses 602-603 may previously be stored to the memory of the information processing apparatus 604, or temperatures of subtracting a margin(s) from the operation guaranteeing temperatures of exhaust air which are provided at the specifications of the information processing apparatuses 602-603 may previously be stored to the memory of the information processing apparatus 604 as information of the allowable temperatures of the exhaust air.

Also, the information processing apparatus 604 can calculate intake air allowable temperatures B212 with regard to the respective information processing apparatuses based on the acquired measurement results of the respective temperature sensors, the acquired information of power consumptions of the respective information processing apparatuses, the information of the allowable temperatures of the exhaust air of the respective information processing apparatuses, and information of restricting the power consumptions of the respective information processing apparatuses which are set by an operator. The information of restricting the power consumptions of the respective information processing apparatuses is, for example, restriction values of CPU using rates which are respectively set for the information processing apparatus 602 and the information processing apparatus 603 by an operator of the information processing system 601, and can be stored to the memory of the information processing apparatus 604.

The information processing apparatus 604 can adjust the set temperature of the outside air-conditioner 105 which is the air-conditioner similar to First Embodiment based on a lower one of the intake air allowable temperatures of the information processing apparatuses 602-603.

For example, in a case where the intake allowable temperature B212 of the information processing apparatus 602 is 28° C., and the intake air allowable temperature B212 of the information processing apparatus 603 is 29° C., the information processing apparatus 604 can make the intake air temperature of the information processing apparatus 602 proximate to a target value by setting the target value of the intake air temperature of the information processing apparatus 602 to 27° C. by subtracting a margin of 1° C. from the intake air allowable temperature B212 of 28° C., and controlling the set temperature of the outside air-conditioner 105 which is the air-conditioner by a PID control while measuring the intake air temperature by the temperature sensor 110 of the information processing apparatus 602. The information processing apparatus 604 determines the set temperature of the outside air-conditioner 105 which is the air-conditioner when the intake air temperature can sufficiently be made to be proximate to the target value. As described above, the set temperature of the air-conditioner can be made to be a high temperature, and therefore, the low power consumption of the information processing system 601 can be achieved. Here, the information processing apparatus 604 is operated as a computer of managing the operation, and therefore, an amount of a given work-load is smaller than those of the other information processing apparatuses, and the intake allowable temperature is higher than those of the other information processing apparatuses. Therefore, the intake allowable temperature of the information processing apparatus 604 may not be taken into a consideration.

The information processing apparatus 604 can further achieve the lower power consumption of the information processing system 601 by stopping or pausing the information processing apparatus having the lower intake air allowable temperature from among the information processing apparatuses 602 and 603. Thereby, the set temperature of the outside air air-conditioner 105 which is the air-conditioner can be adjusted similar to First Embodiment in accordance with the information processing apparatus 602 or 603 having a higher intake air allowable temperature. Therefore, the low power consumption of the information processing system 601 can be achieved by further reducing the power consumption of the cooler equipment.

For example, in a case where the intake air allowable temperature A210 of the information processing apparatus 602 is 25° C., and the intake allowable temperature A210 of the information processing apparatus 603 is 27° C., the information processing apparatus 604 pauses or stops the information processing apparatus 602. Also, the information processing apparatus 604 can make the intake air temperature of the information processing apparatus 603 proximate to a target value by setting the target value of the intake air temperature of the information processing apparatus 603 to 26° C. by subtracting a margin of 1° C. from the intake allowable temperature A210, and controlling the set temperature of the outside air-conditioner 105 which is the air-conditioner by a PID control while measuring the intake air temperature by the temperature sensor 110 of the information processing apparatus 103. The information processing apparatus 604 determines the set temperature of the outside air-conditioner 105 which is the air-conditioner when the intake air temperature can sufficiently be made to be proximate to the target value. As described above, the set temperature of the air-conditioner can be made to be a higher temperature, and therefore, the low power consumption of the information processing system 601 can be achieved by restraining the power consumption of the cooler equipment.

Incidentally, although according to the present embodiment, the information processing apparatuses to which the work-load is applied are made to be 2 pieces of the information processing apparatuses 602-603, a number of pieces of the information processing apparatuses may be 3 or more. In a case where the number of pieces of the information processing apparatuses is 3 or more, the low power consumption of the information processing system can be achieved by adjusting to set the temperature of the air-conditioner based on the intake air allowable temperature of an information processing apparatus having the lowest intake air allowable temperature in the operating information processing apparatuses. Also, the low power consumption of the information processing system can be achieved by predominantly stopping or pausing an information processing apparatus having a lower intake air allowable temperature in 3 piece or more of information processing apparatuses.

Third Embodiment

Figure 7:
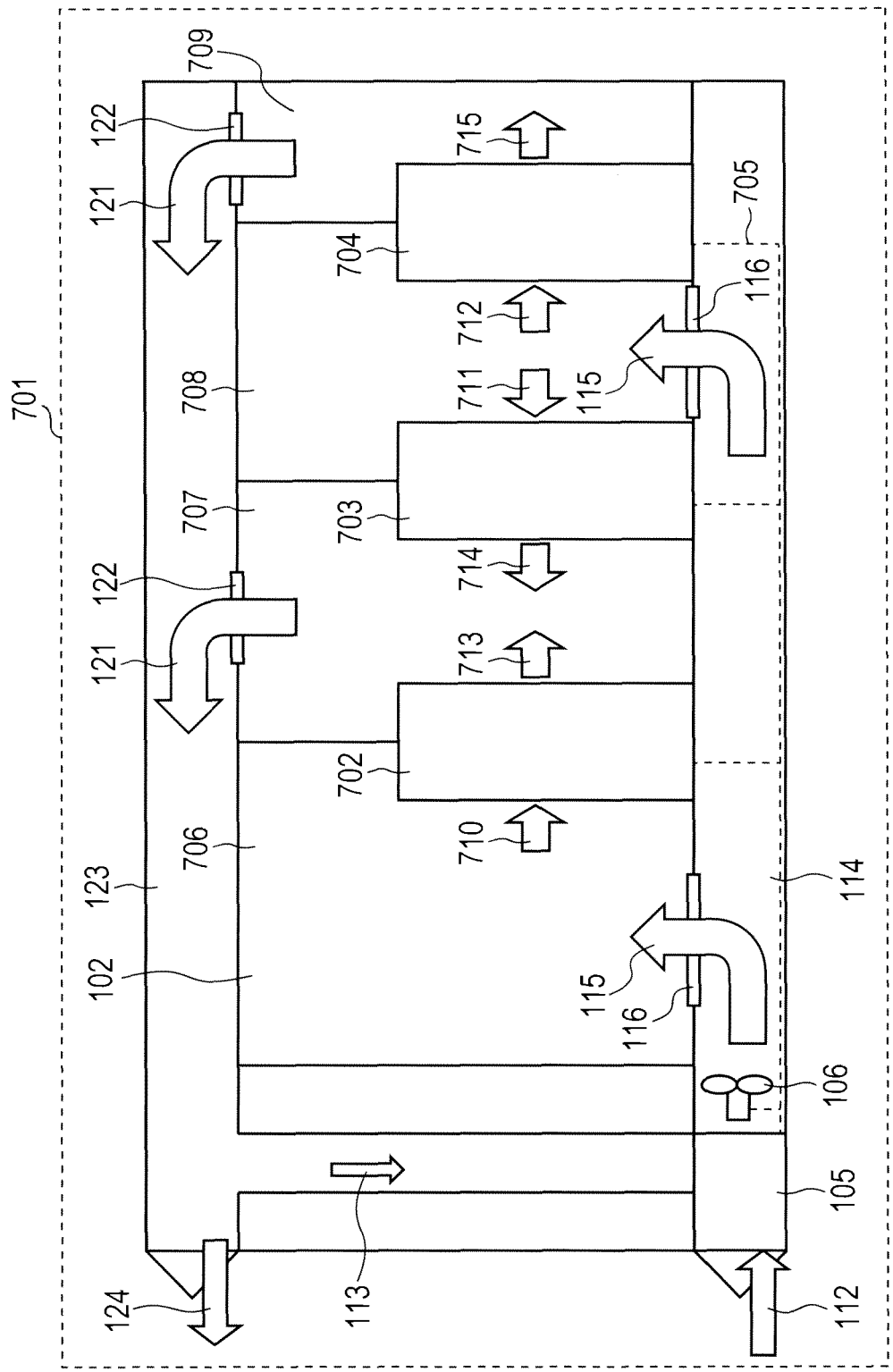
FIG. 7 is a diagram showing an example of a data center to which an information processing system according to the present invention is applied.

Although in First Embodiment and Second Embodiment, there has been shown an example of an information processing system including 1 piece of rack, according to the present embodiment, there will be shown an example of a data center having an information processing system including plural rack rows. FIG. 7 shows a data center 701 of the present embodiment. In the following, an explanation will mainly be given of what differs from the explanation of First Embodiment and Second Embodiment, and an explanation common to First Embodiment or Second Embodiment will be omitted.

The data center 701 includes rack rows 702-704 in place of the rack 103 of First and Second Embodiments. At least single pieces of information processing apparatuses are respectively mounted to the respective rack rows similar to First and Second Embodiments. Each of the information processing apparatuses provided at the rack rows 702-704 includes a server device, a router device, and a storage device. One piece of the information processing apparatuses provided to the rack rows 702-704 is operated as a computer for managing an operation. A redundant configuration may be constructed by providing plural pieces of information processing apparatuses for managing the operation. A control signal from the computer for managing the operation is transmitted to the respective information processing apparatuses, the outside air-conditioner 105, and the air fan 106 via wirings 705 indicated by a dotted line.

Upper portions of the respective rack rows are subjected to aisle capping, and the computer room 102 is partitioned to a cold aisle 706, a hot aisle 707, a cold aisle 708, and a hot aisle 709.

As shown in FIG. 7, cold air is introduced from the blow out ports 116 to the cold aisle 706 and the cold aisle 708. The cold air of the cold aisles is introduced to the respective rack rows as indicated by arrow marks 710-712, and warm air produced at the respective information processing apparatuses is exhausted to the respective hot aisles as indicated by arrow marks 713-715. The warm air of the respective hot aisles is exhausted from the suction port 122 to the exhaust duct 123.

The data center 701 can also achieve the low power consumption similar to the information processing system 601 of Second Embodiment. For example, the low power consumption of the data center 701 can be achieved by adjusting to set the temperature of the air-conditioner based on the intake allowable temperature of the information processing apparatus having the lowest intake air allowable temperature in operating information processing apparatuses. Also, the low power consumption of the data center 701 can be achieved by predominantly stopping or pausing the information processing apparatus having the lowest intake air allowable temperature in the information processing apparatuses.

What is claimed is:

1. An information processing system including a plurality of information processing apparatuses, and an air-conditioning equipment of cooling the plurality of information processing apparatuses, the information processing system comprising:
a first sensor that detects a temperature of intake air to each of the information processing apparatuses; and
a second sensor that detects a temperature of exhaust air of each of the information processing apparatuses,
wherein an allowable temperature of the intake air of each of the information Processing apparatuses is determined based on a result of detecting the temperature of the intake air of each of the information processing apparatuses by each of the first sensors, a result of detecting the temperature of the exhaust air to each of the information processing apparatuses by each of the second sensors, a piece of information of a power consumption of each of the information processing apparatuses, and a piece of information to an allowable temperature of the exhaust air of each of the information processing apparatuses, wherein when the information processing apparatus has a temperature of the intake air that is lower than the allowable temperature, the information processing apparatus is predominantly paused or stopped in the plurality of information processing apparatuses.

2. The information processing system according to claim 1, wherein the air-conditioning equipment is controlled based on the determined allowable temperature of the intake air to each of the information processing apparatuses.

3. The information processing system according to claim 1, wherein the air-conditioning equipment includes an outside air-conditioner.

4. The information processing system according to claim 1, claim wherein the information processing apparatus is a server device.

5. A data center comprising:
the information processing system according to claim 1.

6. An information processing system including a plurality of information processing apparatuses, and an air-conditioning equipment of cooling the plurality of information processing apparatuses, the information processing system comprising:
a first sensor that detects a temperature of intake air to each of the information processing apparatuses; and
a second sensor that detects a temperature of exhaust air of each of the information processing apparatuses,
wherein an allowable temperature of the intake air of each of the information processing apparatuses is determined based on a result of detecting the temperature of the intake air of each of the information processing apparatuses by each of the first sensors, a result of detecting the temperature of the exhaust air to each of the information processing apparatuses by each of the second sensors, a piece of information of a power consumption of each of the information processing apparatuses, and a piece of information to an allowable temperature of the exhaust air of each of the information processing apparatuses,
wherein when the allowable temperature of the intake air of the each of the information processing apparatuses is determined, the allowable temperature of the intake air is determined further based on a piece of information of restricting the power consumption set to each of the information processing apparatuses.

7. The information processing system according to claim 6, wherein when the information processing apparatus has a temperature of the intake air that is lower than the allowable temperature, the information processing apparatus is predominantly paused or stopped in the plurality of information processing apparatuses.

8. The information processing system according to claim 6, wherein the air-conditioning equipment is controlled based on the determined allowable temperature of the intake air to each of the information processing apparatuses.

9. The information processing system according to claim 6, wherein the air-conditioning equipment includes an outside air-conditioner.

10. The information processing system according to claim 6, wherein the information processing apparatus is a server device.

11. A data center comprising:
the information processing system according to claim 6.

12. An operation management method of an information processing system, wherein a computer for managing an operation of an information processing system including a plurality of information processing apparatuses, and an air-conditioning equipment of cooling the plurality of information processing apparatuses:
acquires a piece of information of a temperature of intake air to each of the information processing apparatuses, a piece of information of a temperature of the exhaust air of each of the information processing apparatuses, and a piece of information of a power consumption of each of the information processing apparatuses; and
determines an allowable temperature of the intake air of each of the information processing apparatuses based on the piece of information of the intake air to each of the information processing apparatuses, the piece of information of the temperature of the exhaust air of each of the information processing apparatuses, the piece of information of the power consumption of each of the information processing apparatuses, and a piece of information of an allowable temperature of the exhaust air of each of the information processing apparatuses,
wherein when the information processing apparatus has a temperature of the intake air that is lower than the allowable temperature, the information processing apparatus is predominantly paused or stopped in the plurality of information processing apparatuses.

13. The operation management method of an information processing system according to claim 12, wherein the air-conditioning equipment is controlled based on the determined allowable temperature of the intake air of each of the information processing apparatuses.

14. An operation management method of an information processing system, wherein a computer for managing an operation of an information processing system including a plurality of information processing apparatuses, and an air-conditioning equipment of cooling the plurality of information processing apparatuses:
acquires a piece of information of a temperature of intake air to each of the information processing apparatuses, a piece of information of a temperature of the exhaust air of each of the information processing apparatuses, and a piece of information of a power consumption of each of the information processing apparatuses; and
determines an allowable temperature of the intake air of each of the information processing apparatuses based on the piece of information of the intake air to each of the information processing apparatuses, the piece of information of the temperature of the exhaust air of each of the information processing apparatuses, the piece of information of the power consumption of each of the information processing apparatuses, and a piece of information of an allowable temperature of the exhaust air of each of the information processing apparatuses,
wherein when the computer for managing the operation determines the allowable temperature of the intake air of each of the information processing apparatuses, the allowable temperature of the intake air is determined further based on a piece of information of restricting the power consumption set to each of the information processing apparatuses.

15. The operation management method of an information processing system according to claim 14,
wherein when the information processing apparatus has a temperature of the intake air that is lower than the allowable temperature, the information processing apparatus is predominantly paused or stopped in the plurality of information processing apparatuses.

16. The operation management method of an information processing system according to claim 14, wherein the air-conditioning equipment is controlled based on the determined allowable temperature of the intake air of each of the information processing apparatuses.

\* \* \* \* \*